(12) United States Patent
Rubin

(10) Patent No.: US 7,849,028 B2
(45) Date of Patent: Dec. 7, 2010

(54) ELECTRICAL PACKAGE ANALYSIS GATEWAY

(75) Inventor: Barry J. Rubin, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 909 days.

(21) Appl. No.: 11/619,669

(22) Filed: Jan. 4, 2007

(65) Prior Publication Data

US 2008/0168012 A1  Jul. 10, 2008

(51) Int. Cl.
*G06E 1/00* (2006.01)
*G06E 3/00* (2006.01)

(52) U.S. Cl. .......................... 706/19; 206/438; 324/689

(58) Field of Classification Search .................. 706/19; 716/14; 703/14
See application file for complete search history.

(56) References Cited

U.S. PATENT DOCUMENTS

| 5,834,840 A | * | 11/1998 | Robbins et al. | 257/705 |
| 2001/0014138 A1 | * | 8/2001 | Knigge et al. | 378/57 |
| 2005/0133909 A1 | * | 6/2005 | Franca-Neto | 257/724 |
| 2006/0230314 A1 | * | 10/2006 | Sanjar et al. | 714/26 |

* cited by examiner

*Primary Examiner*—Michael B. Holmes
*Assistant Examiner*—Kalpana Bharadwaj
(74) *Attorney, Agent, or Firm*—Scully, Scott, Murphy & Presser, P.C.; Daniel P. Morris, Esq.

(57) ABSTRACT

A method and system is provided for analyzing a package having components. The package may include electrical or computer components. The method and system uses a computer program to receive inputted data and extract data from files. The computer program also selects the best sub-program to analyze the data to compute the parameters for packaging the components and designing the package, and displays the results of the analysis.

20 Claims, 1 Drawing Sheet

ELECTRICAL PACKAGE ANALYSIS GATEWAY

FIELD OF THE INVENTION

The invention relates to a method and system for analyzing a package such as an electronic package having components using a computer program, and more particularly, a computer program which selects from a plurality of sub-programs for best analyzing data about the package which may include electronic components.

BACKGROUND OF THE INVENTION

Typically a package includes components for support and passive and active electronic components for functional application. For example, an electrical package may include passive and active electronic components such as structure that electrically supports one or more chips and/or circuits of a computer or other electrical device. The electrical package also provides for the voltages and currents that supply the circuits and also provides for the transport of signals between the circuits. Many different parameters and effects need to be modeled to design and build the electrical package. Further, the electrical package needs to reasonably assure, for example, that the signals between circuits are acceptable, that noise generated by circuit switching and coupling is not severe, and that electromagnetic interference and compatibility meet requirements.

To accomplish the analysis required to design and package a device having components, for example, an electrical package, many different and specific programs or tools are employed. For example, tools which can ascertain capacitance, inductance, resistance, and full-wave tools. A full-wave tool generally includes all effects predicted by Maxwell's equations, and thus, Maxwell's equations are incorporated in the analysis. Maxwell's equations represent a concise way to state and develop the working relationship between electricity and magnetism. Further, many package parameters that need to be analyzed cannot be calculated directly from the related structure, but require that other elements such as conductors or power sources or artificial ground planes be introduced. With regard to this analysis, even experienced package engineers often do not know off-hand which tool is most appropriate, or how to set up some of the structures extract the desired parameters. The novice or non-package engineer in addition may not know what values to assign the parameters required for input into these tools. Often, large numbers of similar calculations need to be made repeatedly. This is time consuming and labor intensive. These issues often steer the novice away from using analysis tools that would greatly enhance their work, as well as, often cause an expert designer to avoid or take shortcuts in the analysis to save time and effort.

Currently, a system, or program, or set of tools (programs) have not adequately resolved the disadvantages described. Advancements in package analysis often give rise to more complicated tools, not tools easier to use. They often involve the use of Graphical User Interfaces (GUI), or text mechanisms for data entry. Even the most user friendly of these requires many keystrokes or clicks to define and solve and generate the required results. Further, such tools often involve a specific kind of calculation, such as capacitance or inductance, and do not provide a comprehensive packaging solution. Even those tools that have many different underlying analysis codes require the user to make many decisions, to refer to complicated manuals, or to ask questions to support personnel.

It would therefore be desirable to provide a packaging program or tool that interfaces between the user and a large number of underlying computer programs or codes. Further, it would be desirable to have a packaging tool that automatically decides, from available information, which tool to use and how to analyze the structures to calculate the packaging parameters. It would further be desirable to provide a packaging tool which when provided incomplete information, intelligently determines missing parameter values. It would also be desirable to provide a packaging program or tool which lessens repeated calculations and reduces data entry into the tool.

SUMMARY OF THE INVENTION

In an aspect of the present invention a method for analyzing a package having components using a computer program saved on computer readable medium includes inputting data into a computer program, and determining which of a plurality of programs to use for analyzing the data and selecting a program. The data is analyzed using the selected program to calculate parameters for packaging the components, and the results of the analysis are displayed.

In a related aspect of the invention the method analyzes the data to determine at least the kind of components and calculates a plurality of design parameters.

In a related aspect of the invention, the program is able to provide geometric parameters for the components from the data.

In a related aspect of the invention, the data includes specifications for electrical components which the program uses to calculate design parameters.

In a related aspect of the invention, the method further includes extracting data from at least one file.

In a related aspect of the invention, the package is an electrical package including electrical components.

In a related aspect of the invention, the package is an electrical package including an integrated circuit and semiconductor components.

In a related aspect of the invention, the method includes sending the results to a receiving device for display.

In a related aspect of the invention, the program includes approximating missing data by generating calculations from the existing data.

In a related aspect of the invention, the program analyzes the data to determine at least the kind of component and its dimensions.

In a related aspect of the present invention, the method further comprises analyzing the data using a selected template generated by the program and adapted for analyzing a particular package.

In another aspect of the present invention, a computer program product including program instructions is saved on computer readable medium communicating with a computer system such that the computer uses the computer system program instruction for executing a method for analyzing a package which comprises inputting first data into a computer program, and extracting second data from at least one file into the computer program. The program determines which of a plurality of programs is best for analyzing the first and second data and selecting a program. The program analyzes the first and second data using the selected program to provide parameters about packaging the components. The program calculates at least one parameter by using the first and second data to determine missing data, and displays the results of the analysis.

In another aspect of the invention, an electrical package analysis system is provided for analyzing an electrical package having components which comprise a computer program saved on a computer readable medium, and a computer system for executing the computer program. The computer system includes a display and data entry device for a user to enter data into the computer program. The computer program is adapted to extract data from at least one file, and the computer program controlling a plurality of sub-programs and determining and selecting which of the plurality of sub-programs is used for analyzing the data entered by the user and extracted from at least one file to provide an analysis of the package including parameters for designing the package.

In a related aspect of the invention, the program calculates a multiplicity of parameters using the data.

In a related aspect of the invention, the system further includes a saved file including previous electrical package analysis data on the computer readable medium and accessible to the computer program wherein the program calculates parameters using the previous electrical package analysis data.

In a related aspect of the invention, the computer program generates at least one template for analyzing a particular package.

BRIEF DESCRIPTION OF THE DRAWINGS

These and other objects, features and advantages of the present invention will become apparent from the following detailed description of illustrative embodiments thereof, which is to be read in connection with the accompanying drawing, in which.

DETAILED DESCRIPTION OF THE INVENTION

Figure 1:
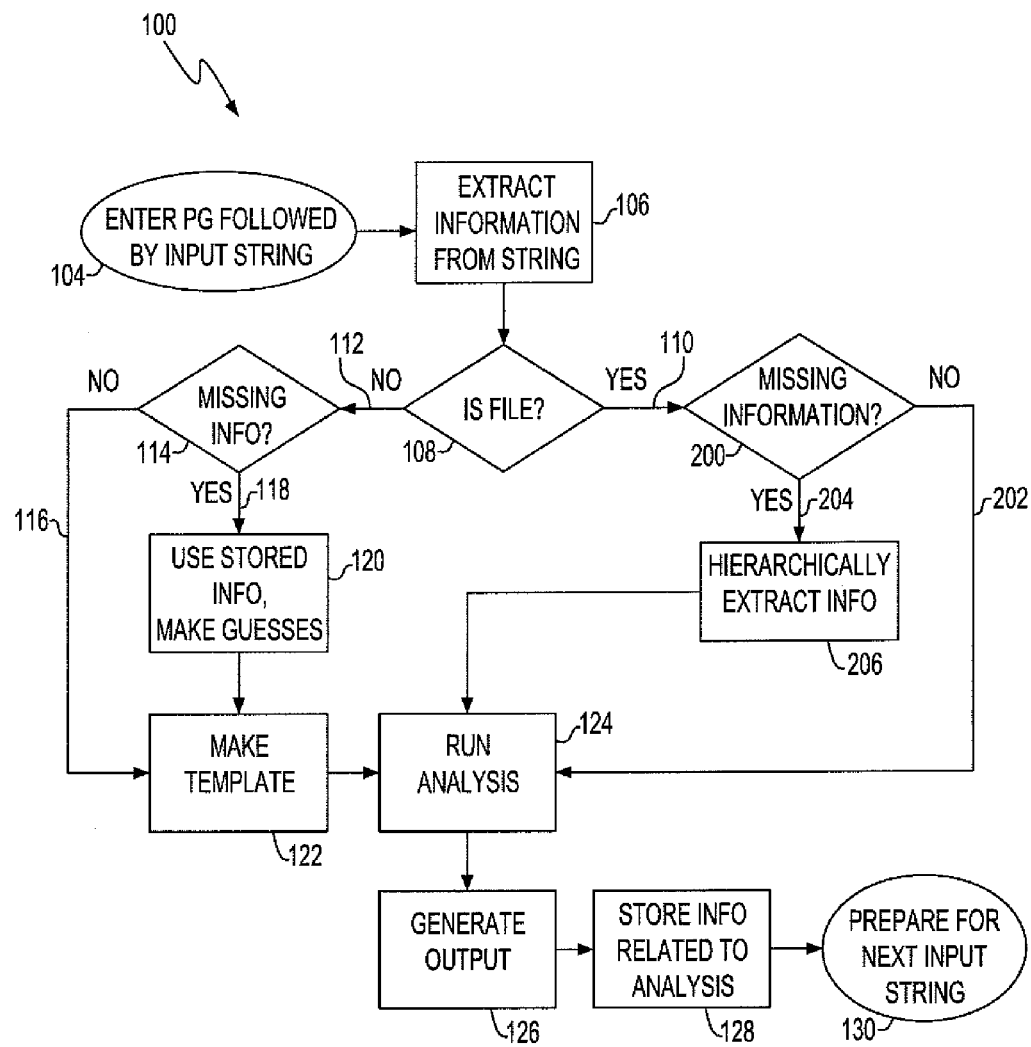
FIG. 1 is a flow chart of method steps according to one embodiment of the invention.

A package may include structure that supports other components in the package. If the package is an electrical package, the package may include structure that electrically supports the chips and circuits of a computer or other electrical device. The electrical package also provides for the voltages and currents that supply the circuits and also provides for the transport of signals between the circuits. Different parameters and effects are modeled by a designer or engineer to both design and to package the electrical package.

An embodiment of the present invention provides an electrical package analysis gateway ("EPAG" or "PG program" or "PG" for short ). The PG is a gateway because it serves as an entry point to a highly complicated and involved area of analysis including multiple sub-programs or sub-tools. The PG may also be used for other type packages requiring analysis, such analyses may include, for example, fluid analysis, mechanical analysis, thermodynamic analysis. Additionally, the file names used herein are illustrative, and it is understood that other file names appropriate to other programs can be used.

In one embodiment of the invention the electrical package analysis gateway tool (PG or PG program) uses a computer program to perform an analysis of an electronic package where the computer program uses multiple tools or sub-programs to best perform analysis of the target electronic package. The electronic package may be, for example, a semiconductor IC (integrated circuit) package.

Referring to FIG. 1, a user accesses the PG program 100 by entering "pg" 104. The PG program 100 requires as input a string of characters and/or numbers that represent file names, parameters, units or instructions 106. Ideally, these terms are entered through abbreviations that are commonly used and understood by those skilled in the art of engineering design and packaging, and that by design will be recognized by the PG program. The tool automatically analyzes structures defined by files 108 or generates templates 122 of structures that are then internally analyzed. Other facilities include the ability to determine the value of a geometrical parameter that gives rise to a particular package design parameter, such as finding a given value of a signal line height that gives rise to a given value of characteristic impedance, and facility to convert between units and to make other calculations that package engineers often require. As more users adapt the use of the tools, all the benefits of employing a common set of tools within an organization are gained (consistency in results, for example). Further, the tool may be personalized to any or each user, and thus any ambiguity with regard to the tool correctly interpreting a parameter or analysis is less likely.

According to the present invention, the keystrokes entered by a user indicate a particular type of analysis The type of analysis may be determined through inspection of the structure using the file, and may not need any extra terms entered by the user. In one embodiment of the invention the type of analysis may be completely determined using the file, and the user need enter no extra terms. In another example, input terms such as capacitance may be entered to force the analysis to be capacitance analysis or if some ambiguity is expected. Other input terms may, for example, be related to capacitance, inductance, resistance, or full-wave calculations. This request is not overridden except in the case where an inconsistency occurs, for example, if the structure has a source element but a capacitance analysis is requested. This would result in an inconsistency because a source should not appear in a capacitance analysis. In this case, the tool may override the user and perform a full-wave analysis which requires source elements. For example, if the tool parses the structure, and through a topological investigation, a tree is constructed to show the connectivity of conductors and it is found that all conductors are connected together, then only a single plate exists and a capacitance analysis is unlikely. In this case, if resistivity is given and elements called "yelements" (defined herein) are present, then a resistance and/or inductance analysis will be done. Actual names or abbreviations of the specific capacitance or other tool can also be named in the input as a request.

In one embodiment of the invention, the term "view47" is taken to mean that a graphic or other description of the template or analyzed structure is placed on the computer screen for 47 seconds and then erased. The user may use the PG generated template as a starting point, and modify or add to it for a subsequent analyses. The PG program will attempt to generate answers if possible. If after all attempts fail to determine the indicated analysis and the required parameters, then the user may be prompted with suggestions.

With regard to parameters that are entered, the abbreviations for such parameters are, for example, "t" for thickness, "w" for width, "h" for height, "p" for period, "s" for spacing, "r" for resistivity, and "rad" for radius. The parameters used may indicate the structure for a template that the PG program may construct to generate 124 the required output 126 (shown in FIG. 1). For instance, if only t, w, and h are entered, the structure is likely to be a simple power plane with a signal line "h" units above having thickness "t", width "w". An "s" that is part of the input string may be interpreted as a second signal with center-to-center spacing of "s". The presence of a "p" for period likely indicates the power plane to be of mesh-type construction. The presence of "rad" may indicate a via and a related analysis.

The terms "mm", "mils", "um", "m", "cm", and "in" are likely units, and the tool will change from default to the unit indicated. If one of these units appears at the beginning or end of a string of strictly numerical values (no characters) it likely indicates the user wants a units conversion of the entered numbers. Units for frequency, time, and other parameter values may be entered by the user. A change can be made at any time by entering a unit and its new value. Default values are employed when the tool is first started.

For example, entering the input string "w3 t5 h e4. 1 find50", may indicate a signal line having width of 3 units and thickness of 5 units over power plane within a medium having relative dielectric constant 4.1 and where a value for "h" is not given ("h" would normally not be in the input string, but is shown here without a value following it to indicate that the value is missing and the code will be calculating the parameter). Consistent with the common request of package engineers to find a parameter or set of parameters that yield a particular characteristic impedance for a design, an iterative or other analysis or evaluation of a closed form expression will be used to find the value of h that yields a 50 ohm impedance.

In an example where the input string is "cm w3 t2 h5 e4. 1h9", which indicates a signal line between the power plane and a second power planes located at a height of 9 cm. The PG program would conduct a 2D analysis for the signal line parameters because no length is indicated, with all dimensions being given in "cm". If the next string of parameters is such that not enough information is contained to determine a template to analyze, this information may be combined with the previous information. In the situation where duplicate entries exist in the tool, the parameter most recently entered is used by the program or tool. For example the entered string w5 10.001 means that the previous structure should be analyzed with width now 5 cm and the dielectric is now defined by a relative permittivity of 4.1 and a loss tangent of 0.001.

According to the present invention, the command "clear" or "clean" means to clear the history of all terms and file names previously entered and thus stored by the tool. The clear or clean command assures that the tool will not be confused if the information is ambiguous in any way.

With regard to the analysis or other output generated, the user will be able to make requests as to the format of the output, which will be honored if possible. Otherwise a default format output is indicated. Outputs may be given as specific parameters and their units, in tabular form if indicated, plotted if indicated, or another form. The output of the entire session may be saved in a file automatically, or only the output for the last analysis saved.

In an embodiment of the method of the present invention a computer program for an electrical package analysis gateway tool (tool, PG, or PG program) is presented. The PG program or tool uses a plurality of sub-tools or sub-programs. The PG program determines which is the best tool or best combination of tools to use in the electrical package analysis. The method includes a user inputting the command "PG" (as an abbreviation for electrical package analysis gateway). The user may input the command "PG" in either upper or lower case where lower case is easier for the user to enter as it requires less effort than upper case (there is no shift required). The command "pg ex1" (the contents of which are shown I Chart 1) is met by an automatic solution through internal determination that ex1 is a file of the type ".modla" (which is a file type for exemplary purposes in the following examples used by sub-tools or sub-programs, and there is also a corresponding file of the type .modl, which is binary and thus only machine readable and understood by the GUI) and that it contains a structure. When only the file name has been entered, the tool determines that the user requests an analysis of the particular structure and automatically determines, for example, whether a capacitance, inductance, resistance, full-wave, 2D or 3D analysis is required. If the required frequency file (an auxiliary file containing a list of frequencies that is often required by some sub-tools) has not been entered, the working directory is searched for a like-named frequency file, or one recently used or modified by the user. If the frequency file is not found a default file is generated based on information available.

CHART 1

| Contents of ex1.modla |
| --- |
| # Input file name: ex1.modl 14:57 19-Jul-06 |
| # Platform: F0 Version: 0 |
| # Number of bodies: 4 |
| # All coordinates in this file are in mm |
| Body 0 Box (solid) |
|     0.000000  −0.700000  0.000000 |
|     0.500000  0.700000  0.140000 |
|   Attribute Material = D: 4 |
|   Attribute Color = LightBlue |
| Body 1 Box (solid) |
|     0.000000  −0.700000  −0.020000 |
|     0.500000  0.700000  0.000000 |
|   Attribute Material = C: 1.74e−06 99 |
|   Attribute Color = Wheat |
| Body 2 Box (solid) |
|     0.000000  0.050000  0.140000 |
|     0.500000  0.130000  0.160000 |
|   Attribute Color = Wheat |
|   Attribute Material = C: 1.74e−06 1 |
| Body 3 Box (solid) |
|     0.000000  −0.130000  0.140000 |
|     0.500000  −0.050000  0.160000 |
|   Attribute Material = C: 1.74e−06 2 |
|   Attribute Color = Wheat |
| # Units code: 5 (microns) |

In another example embodiment of the computer program according to the present invention for an electrical package analysis gateway tool, the command "pg mils t1 w3 h5 p10" is entered by a user. The program identifies the letters being commonly-used symbols that describe geometric features of or parameters of a structure, i.e., an electrical package. The command symbols are interpreted as a signal line above a mesh-type power plane, with signal thickness 1 mil, width 3 mils, height 5 mils, and mesh period 10 mils. The default units of the parameters can be set to mm, and can be modified by the user to be mils, as in the embodiment above, or another unit. A template for analyzing particular packages may be internally generated. The PG program can look to a particular template which fits a set of parameters, such as, a signal line over a ground plane. The PG program may include a plurality of templates to fit different parameter sets. In the current example, the PG program looks to the internal templates and finds one that is appropriate considering only the four parameters given. Any missing information is intelligently determined internally 120 (shown in FIG. 1), the most appropriate sub-tool (sub-program) is chosen, and a solution provided. The program can determine missing information 118 by using stored information and approximations 120 (shown in FIG. 1).

In another embodiment of the present invention, the computer program for the electrical package analysis gateway tool (tool) receives a command "pg 5.6 8.9 4.6 cm" from a user. The tool recognizes the command as a unit(s) conversion because only numbers and a unit are contained in the input string. The tool converts and outputs the values of 5.6 cm, 8.9 cm and 4.6 cm in mils. It is assumed, in this case, that pg currently has the units set to be mils. However, for example, the user might have previously issued the command pg mils, which replaces any existing default with mils. Further, as another example, a command pg cm 5 mils could have been set up to convert from cm to mils, or from mils to cm, as a customers preference.

In another example, the command input of "pg t1 w3 h find50" is interpreted as a command to find the height of a signal line with thickness 1 mil and width 3 mils situated a parameterized distance "h" above a ground plane. The tool assumes that the "find50" part of the command input is a request to find characteristic impedance and that height ("h") is the parameter sought because the simplest structure that is usually related to the entered information is a signal line over solid ground plane. The tool tries to find the simplest structure that can be made with the given parameters, and in this case, it would be a signal line over a plane. The tool is able to ascertain that since the required height "h" is without an assigned value it is the parameter that requires a solution. Further, no dielectric constant has been entered, thus, free space is assumed. Therefore, the tool is intended to provide results for the mostly likely associated structure.

Since the output will contain all the structure parameters and assumptions, the user can decide if the structure selected is correct, and if not, enter additional information. The command "pg e4.2" is interpreted as being associated with the previously entered parameters and the relative dielectric constant is changed from the free space value of unity to 4.2 and the height h corresponding to a 50 ohm impedance is recalculated. The entry of only a single parameter almost certainly means that previous data must be augmented. The relative dielectric constant was not previously entered, thus, the input should be modified accordingly. For example, the user may change a single parameter over and over again to see how the impedance changed.

The sub-tool(s) (sub-program(s)) works by parsing the entered information and determining factors including: whether the entered symbols represent files (that contain related information); parameters that may be used for construction and analysis of a template; physical units to be used; or a hint or request for a particular feature or type of analysis. User requests may be implemented if no inconsistency results, for example, a request for inductance on a file that does not contain the elements called "yelements" (which is a fictional file type for exemplary purposes where the "yelements" are needed for inductance calculation by sub-tools) will most likely be overridden if a more appropriate solution type is internally deemed more appropriate. In one example, the tool may add yelements at intelligently guessed locations and perform the inductance analysis. Thus, the tool has an internal set of hierarchies 206 (shown in FIG. 1). The hierarchies may be modified by the user or through entered commands or files. Commonly used and accepted terms will be recognized, however, abbreviations may also be used to enter information more efficiently because of the reduced number of required keystrokes.

The sub-tools may store previously entered information and also extract the intent of the user through this information. The sub-tools can offer a number of different faces to the user, such as beginner or advanced, and may be customized by or for the user, by the tool itself or from extracted information.

Another embodiment according to the present invention includes electrical packaging analysis using the method described above of inputting data and accessing information from specified files. Information may be extracted by using methods employed by the PG program. The PG program methods may include, for a two dimensional (2D) structure, ascertaining the cross-section shapes, dimensions and the material of the conducting bodies. The skin depth of the structure can be calculated as well as a range of frequencies over which large variations in typically calculated parameters are expected. A default frequency file (list) can be obtained by including the before mentioned frequencies, from the lowest frequency in the range to the highest frequency in the range, and also a frequency value which may be considered the highest needed frequency for any such related 2D package analysis.

In one example of the PG program parsing the structure, where a cutting plane contains all the cross-sections, the structure is likely 2D. When the program recognizes the shapes are not 2D or 3D rectangles, the need for a non-rectangular allowing code is indicated.

For parsing an electrical structure, such as a semiconductor chip, the lengths, resistances, and cross-section sizes entered by a user, will likely indicate whether the structure is part of a chip, board or module. Typically a semiconductor chip may include a substrate having layers of reference planes with perpendicularly positioned vertical connecting elements called vias. The upper surface of the substrate may include a plurality of electrical components manufactured using existing processing techniques. The tools of the present invention determine if a number of contiguous conductors having the same thickness lie on the same plane, then those conductors are most likely part of a power (reference) plane of a power supply voltage. If the tools sense islands of touching contiguous conductors, they are likely to be a power plane of different supply voltages. Conductors of relatively constant and round or oval cross-section that run perpendicular to these planes are likely to be vertical connecting elements, i.e., vias. Segments of constant rectangular or trapezoidal cross-section running parallel to the planes are likely signal lines. Thus, the PG program and sub-programs (tools and sub-tools) can ascertain the power and signal layers. Dielectric layers will almost certainly exist between the power and signal layers. From the dielectric constant and other parameters, a likely range of frequencies can be found. The type of analysis can often be inferred from the existence in the file of elements used in particular calculations, such as in the previous example, yelements.

Additionally, the PG program can search a working directory and files containing data of similar structures to extract information about similar structures which have already been similarly parsed. Also, files containing output may possibly be traced backed to the files that served as input. The output files will likely contain relevant information, possibly even a list of all the parameters involved in the analysis. The dates of generation and or last use of the files can be ascertained so an intelligent guess 120 (shown in FIG. 1) as to the composition of files that are missing can be made and thus the file may be constructed by default.

Referring to FIG. 1, a high level of operation of the PG 100 according to the present invention is shown. The PG's steps of operation include a user accessing the PG program and inputting an input string 104, and the PG program extracting information from the input string 106. If a file does not exist 108 the PG program continues 112 to search a database of files 114 to supply missing information. If the search results in data files supplying missing information 118, then the PG program uses the stored information to make approximations 120. If no useful data is found 116 the PG program generates a template 122. The template is a model of a structure or structural elements of a package. A library of templates could be developed to cover all the typical structural elements of a package. The template is a compromise with the idea that the basic structure could appear many times in a given design. Particular dimensions are not part of the template, because that would make it too specific and unlikely to ever be used. If a file exists 108 for the PG program to access for more data the program continues 110 to supply missing information 200 using the file. The available missing information 204 is hierarchically extracted by the PG program 206, and then the PG program runs an analysis 124.

Hierarchically extracted information refers to the concept that there are many mechanisms to retrieving missing information, some of which should be tried before others. For example, if a file ex1.modla exists, and there is a file in the directory called ex1.freq, it makes sense to use this file if no frequency information is otherwise indicated. If ex1.freq did not exist, then other files should be searched for frequency info, and further, the most recently generated may be searched first. If still no information is found, then the structure should be analyzed and based upon dimensions and resistivity and other parameters, an appropriate frequency range determined. The list below is some exemplary search approaches that can be used to find information. The order can be customized by the user. Information can be found by searching: 1) files listed in PG input string; 2) files in a directory, based on date, name, or other parameter; 3) investigating physical structure defined through file given in input string; 4) investigating output files based on date, name, or other parameters; 5) investigating a history file that PG stores during an analysis session; and 6) approximating, based on information in PG input string.

If the missing information is not available 202 the PG program runs the analysis 124 with the information already obtained. After running the analysis, the PG program generates an output 126 and can display the result or send the results to another system. The information related to the analysis can be stored 128, and the program is prepared for the next input string 130.

Parsing of a structure by analyzing files and using data entered by the user results in the PG program ascertaining the shape of the package as an additional means for determining the electrical components in the package and hereby assisting in the determination of the design parameter that will be required in the electronic package. Spiral shaped signal lines are likely spiral inductors that likely indicate an inductance analysis is required. If resistivity information exists, an inductive-resistive analysis over a range of frequencies is indicated. Large conductors that appear to be plates and that are closely spaced may indicate capacitors, and thus may initiate a capacitance analysis. The existence of sources and or terminations may indicate a resistive or even fill-wave analysis. If the presence of delay lines, usually having what is called meander shape can be identified, a combined capacitive-inductive or full-wave analysis is indicated. If materials contain frequency dependencies, a frequency domain type of analysis is indicated.

In another embodiment of the electronic package analysis gateway tool (PG) according to the invention, the PG program initiates and controls the analysis process or method. In a first step of the method according to the PG program, the PG program determines if an input of "ex2" is a file, and if so, what kind of file.

In a second step, the PG program has a number of file readers included in its programming. The PG tries to read file ex2 using the .modla reader and a successful read is indicated by the return code for the .modla reader. The PG program may also look for a suffix on file ex2 and determine that the full name of the file is ex2.modl (the entire contents of the directory are listed in Chart 2). The PG program knows the ex2 file defines a structure.

CHART 2

Contents of ex2.modla

```
# Input file name: ex2.modl 14:57 19-Jul-06
# Platform: F0 Version: 0
# Number of bodies: 8
# All coordinates in this file are in mm
Body 0 Box (solid)
    0.000000   -0.700000    0.000000
    0.500000    0.700000    0.140000
  Attribute Material = D; 4
  Attribute Color = LightBlue
Body 1 Triangle yz (solid)
    0.000000    0.130000    0.140000
    0.500000    0.130000    0.160000
    0.500000    0.140000    0.140000
  Attribute Material = C: 1.74e-06 1
  Attribute Color = Wheat
Body 2 Triangle yz (solid)
    0.000000    0.040000    0.140000
    0.500000    0.050000    0.160000
    0.500000    0.050000    0.140000
  Attribute Material = C: 1.74e-06 1
  Attribute Color = Wheat
Body 3 Triangle yz (solid)
    0.000000   -0.040000    0.140000
    0.500000   -0.050000    0.160000
    0.500000   -0.050000    0.140000
  Attribute Material = C: 1.74e-06 2
  Attribute Color = Wheat
Body 4 Triangle yz (solid)
    0.000000   -0.130000    0.140000
    0.500000   -0.130000    0.160000
    0.500000   -0.140000    0.140000
  Attribute Material = C: 1.74e-06 2
  Attribute Color = Wheat
Body 5 Box (solid)
    0.000000   -0.700000   -0.020000
    0.500000    0.700000    0.000000
  Attribute Material = C: 1.74e-06 99
  Attribute Color = Wheat
Body 6 Box (solid)
    0.000000    0.050000    0.140000
    0.500000    0.130000    0.160000
  Attribute Color = Wheat
  Attribute Material = C: 1.74e-06 1
Body 7 Box (solid)
    0.000000   -0.130000    0.140000
    0.500000   -0.050000    0.160000
```

In a third step, the PG program now reads the structure from the .modla file shown in Chart 2 and determines it has 8 Bodies (Body 0-Body 7). Four of the bodies are rectangles (Boxes) and four of them are triangles. The PG program finds that there are attribute types of C and D which mean the conductors and dielectrics are present. The PG program also looks at the rectangles and triangles (the diagonal points of the rectangles, for instance, define the sets of 6 real numbers that are given on two of the lines for the bodies. The PG program determines that the shapes have the same length in the x direction and all shapes are aligned along the x direction. From the above information, the PG program suspects that the structure is 2D and that a 2D analysis is indicated. The PG program determines that the structure is not purely rectangular, but consists of rectangles and right triangles.

In a fourth step, the PG program also determines that there are other .modl files (such as shown in Chart 3) for structures named ex1, tsop15a, and boardantshield.modl. The PG program can read those .modla files and ascertain, based on the shapes and types of attributes, that those files are 3D and which codes they might be associated with.

CHART 3

Contents of boardantshield.modla

```
# Input file name: boardantshield modl 14:47 19-Jul-06
# Platform: F0 Version: 0
# Number of bodies: 9
# All coordinates in this file are in mm
Body 0 Box (skin)
      25.000000   22.000000   0.000000
      25.000000   23.000000   2.000000
    Attribute Material = C: 0
Body 1 Box (skin)
      75.000000   22.000000   0.000000
      75.000000   23.000000   2.000000
    Attribute Material = C: 0
Body 2 Box (skin)
      25.000000   22.000000   2.000000
      75.000000   23.000000   2.000000
    Attribute Material = C: 0
Body 3 Box (skin)
      25.000000   24.000000   2.000000
     205.000000   25.000000   2.000000
    Attribute Material = C: 0
Body 4 Box (skin)
      25.000000   24.000000   0.000000
      25.000000   25.000000   2.000000
    Attribute Material = C: 0
Body 5 Box (skin)
      25.000000   20.000000   2.000000
      75.000000   21.000000   2.000000
    Attribute Material = C: 0
Body 6 Box (skin)
      25.000000   20.000000   0.000000
      25.000000   21.000000   2.000000
    Attribute Material = S: 0 10 0 'Z' 0.5
Body 7 Box (skin)
      75.000000   20.000000   0.000000
      75.000000   21.000000   2.000000
    Attribute Material = T: 0 50 0 'Z' 0.5
Body 8 Box (skin)
       0.000000    0.000000   0.000000
     100.000000   50.000000   0.000000
    Attribute Material = C: 0
# Units code: 1 (cm)
# Comment:
```

In a fifth step, the PG program analyzes all the different analysis codes included under its umbrella and searches for one that solves 2D problems and allows both rectangles and right triangles. The programs c2d and z2d are the only such programs that conform to these parameters. The cz2d program is the name of the tool that contains both c2d and z2d.

In a sixth step, the PG program determines that the user prefers a 2D analysis for both capacitance and inductance, so the program runs both c2d and z2d. However, a parameter called the background dielectric constant is not contained in the .modl or .modla files.

In a seventh step, the PG program now searches the directory for files with suffixes .arg and files with suffixes .c2dout because the PG program determines that information about the dielectric constant is given in these file types. Files .arg and .c2dout files are created when the code c2d is run and the PG program thinks the user may have made previous runs in this directory. The files ex1.arg and ex1.c2dout exist in this directory, so the PG program reads them and finds that the background dielectric constant is 1. With no other information available, the PG program assumes that the value is 1.

Ideally, file ex2.arg may have already existed, and because it has the same root name as that entered into the PG program, then the PG program would have assumed that ex2.arg contained the dielectric information.

In an eighth step, the PG program now searches the directory for files with suffix .freq, which give a number of frequencies on one line and the actual frequencies in GHz on the next line (for example, a frequency file may contain two lines, the first line gives the number of frequencies and the second line gives the frequencies in GHz). The file z2d needs a frequency file to run. It finds the file 1 khz-log-31.6 ghz.freq and uses the frequencies contained. If a freq file were not found, the PG program might look at a related .arg file, which may contain the name and path of a frequency file, or it could look at .z2dout files for clues as to what frequencies to use. The PG program may also look at the structure and determine from its dimensions and material properties and make up a .freq file.

CHART 4

Contents of file ex1.arg file

```
#Parameters File for /gsa/watgsa/.home/h1/brubin/web/private/pg_env/
ex1.modl
Parameter:
allocatesize: 80000
modla filename: /gsa/watgsa/.home/h1/brubin/web/private/pg_env/
ex1.modla
frequency filename: /gsa/watgsa/.home/h1/brubin/web/private/pg_env/
1khz-log-31.6ghz.freq
grid factor: 0
background dielectric constant: 1
background losstangent: 0
cutting plane: 0
save charge: 0
Gflag: 0
Cflag: 0
Aflag: 1
planeval: 0
```

In a ninth step, the PG program takes the dielectric and frequency information and builds the auxiliary files needed to run c2d and z2d files.

In a tenth step, the PG program runs c2d and z2d files and places the outputs in the working directory.

In an eleventh step, if the user determines the results are not what was expected or satisfactory, the user may input a command into the PG program, for example, PG command ex2 7.freq e2.7. The file 7.freq explicitly gives the required freq file and e2.7 specifies the relative background dielectric constant as 2.7. Or the user may have issued PG command ex2 c2d. This command tells PG to run c2d. Given such explicit instructions, PG would not have run z2d and would automatically run only c2d unless the ex2.modl, upon examination, had contents that indicated it was not a c2d file (for example, if ex2.modl had attributes of the type S for source, this would indicates another sub-program should be run.

In a twelfth step, the PG program will try to determine the user's intent and make the run to obtain results. The user can simply give the PG program additional instructions if a mistake is made or results are not satisfactory to the user.

CHART A

Listing of Files in Working Directory Returned by unix command: ls -l

```
-rwxr-x---  1 brubin brubin     58 Jul 19 11:00 1khz-log-31.6ghz.freq
-rw-r-----  1 brubin brubin     14 Jul 19 10:50 3.freq
-rwxr-x---  1 brubin brubin  20937 Jul 19 14:48 boardantshield.emin
-rw-r-----  1 brubin brubin  72417 Jul 19 14:48 boardantshield.emout
```

CHART A-continued

Listing of Files in Working Directory Returned by unix command: ls -l

| | | | | |
|---|---|---|---|---|
| -rw-r----- | 1 brubin | brubin | 5150 Jul 19 14:47 | boardantshield.modl |
| -rw-r----- | 1 brubin | brubin | 1395 Jul 19 14:47 | boardantshield.modla |
| -rw-r----- | 1 brubin | brubin | 416 Jul 19 14:35 | ex1.arg |
| -rw-r----- | 1 brubin | brubin | 1048 Jul 19 14:35 | ex1.c2dout |
| -rw------- | 1 brubin | brubin | 8296 Jul 19 10:49 | ex1.modl |
| -rw-r----- | 1 brubin | brubin | 3553 Jul 19 14:38 | ex1.z2dout |
| -rw-r----- | 1 brubin | brubin | 14788 Jul 19 10:49 | ex2.modl |
| -rw-r----- | 1 brubin | brubin | 0 Jul 19 14:51 | out |
| -rw-r----- | 1 brubin | brubin | 114790 Jul 19 11:18 | tsop15a.modl |
| -rw-r----- | 1 brubin | brubin | 8275 Jul 19 11:15 | tsop15a.modla |

The present invention is a system (mechanism or tool) for performing highly sophisticated and involved package analysis through an interface that requires a minimum of user-entered keystrokes. The tool internally determines the purpose of the analysis from the context of the entered information through parsing and information extraction from files containing data about the structure. It internally supplies any missing information through a hierarchy of searches within the working directory, through files recently used and saved by the tool, by like-named related files, or by providing an appropriate default. The tool endeavors to always provide an answer. Keystrokes for further cases, once the tool has been started, are minimized through investigation of the previously entered information.

Thus, the present invention simplifies package analysis by providing a package analysis gateway program (PG program) which can make intelligent decisions for the user. The PG program significantly reduces the number of keystrokes needed to run the program. Also, the PG program provides the information by searching data files, or provides an intelligent choice for missing information relating to which analysis code to use. The decisions are made by extracting information from files containing data about the structures to be analyzed, extracting information from any files previously analyzed which are contained in a working computer directory where the analysis is to be performed. The PG program, based on the entered and otherwise available or extractable information, decides which tool is best and runs the analysis. In those cases where entered parameters correspond to a well-known structure class, such as a microstrip or mesh plane, the tool automatically builds the structure and provides the desired results. The tool internally decides values of any missing parameters. The tool also provides simple calculator and unit conversions, and any other calculations that are typically and repeatedly required in package analysis. One of the advantages of the invention is that the PG program reduces the effort needed to run the tool and avoids user distractions such as looking at manuals. The PG program allows the user to focus on the problem and rapidly obtain the desired results.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A method for analyzing an electrical package having components using a computer program saved on computer readable medium including:
   inputting data into a computer program, the step of inputting data including a data string;
   determining automatically which of a plurality of programs to use for analyzing the data and selecting a program for analyzing the data;
   analyzing the data using the selected program to calculate parameters for packaging the components; and
   displaying the results of the analysis.

2. The method of claim 1 wherein the method analyzes the data to determine at least the kind of the electrical components and calculates a plurality of design parameters.

3. The method of claim 1 wherein the program is able to provide geometric parameters for the electrical components from the data.

4. The method of claim 1 wherein the data includes specifications for the electrical components which the program uses to calculate design parameters.

5. The method of claim 1 further including extracting data from at least one file.

6. The method of claim 1 wherein the package is an electrical package including electrical components.

7. The method of claim 1 wherein the package is an electrical package including an integrated circuit and semiconductor components.

8. The method of claim 1 including sending the results to a receiving device for display.

9. The method of claim 1 wherein the program includes approximating missing data by generating calculations from the existing data.

10. The method of claim 1 wherein the program analyzes the data to determine at least the kind of component and its dimensions.

11. The method of claim 1 further comprising:
    analyzing the data using a selected template generated or stored by the program and adapted for analyzing a particular package.

12. A computer program product including program instructions is saved on computer readable medium communicating with a computer system such that the computer uses the computer system program instructions for executing a method for analyzing an electrical package having components comprising:
    inputting first data into a computer program, the step of inputting data including a data string;
    extracting second data from at least one file into the computer program;
    determining automatically which of a plurality of programs is best for analyzing the first and second data and selecting a program for analyzing the data;
    analyzing the first and second data using the selected program to provide parameters about packaging the components;
    calculating at least one parameter by using the first and second data to determine missing data; and
    displaying the results of the analysis.

13. An electrical package analysis system for analyzing an electrical package having components which comprises:
    a computer program saved on a computer readable medium;
    a computer system for executing the computer program, the computer system including a display and data entry device for a user to enter data into the computer program, the data including a data string;

the computer program being adapted to extract data from at least one file; and the computer program controlling a plurality of sub-programs and determining and selecting which of the plurality of sub-programs is used for analyzing the data entered by the user and extracted from at least one file to provide an analysis of the package including parameters.

14. The system of claim 13 wherein the program calculates a multiplicity of parameters using the data.

15. The system of claim 13 further including a saved file including previous electrical package analysis data on the computer readable medium and accessible to the computer program wherein the program calculates parameters using the previous electrical package analysis data.

16. The system of claim 13 wherein the computer program generates at least one template for analyzing a particular package.

17. The method of claim 1, wherein the parameters, from the step of analyzing the data using the selected program to calculate parameters, are used for packaging the components.

18. The method of claim 1, wherein the data string includes a string of characters and/or numbers that represent file names, parameters, units or instructions.

19. The method of claim 1, further comprising:

searching a working directory for a frequency file, or a file recently used or modified by a user.

20. The method of claim 1, further comprising:

generating a default file based on information available when a frequency file is not found after a search for the frequency file.

* * * * *